(12) United States Patent
Kato

(10) Patent No.: US 8,006,910 B2
(45) Date of Patent: *Aug. 30, 2011

(54) WIRELESS IC DEVICE

(75) Inventor: Noboru Kato, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/789,610

(22) Filed: May 28, 2010

(65) Prior Publication Data

US 2010/0237152 A1    Sep. 23, 2010

Related U.S. Application Data

(63) Continuation of application No. 11/964,185, filed on Dec. 26, 2007, now Pat. No. 7,762,472.

(30) Foreign Application Priority Data

Jul. 4, 2007  (JP) ................................ 2007-176360
Sep. 19, 2007  (JP) ................................ 2007-241819

(51) Int. Cl.
*G06K 19/06*    (2006.01)

(52) U.S. Cl. ...................................................... 235/492
(58) Field of Classification Search .................. 235/375, 235/385, 435, 474, 492, 493
See application file for complete search history.

(56) References Cited

U.S. PATENT DOCUMENTS 7,036,741 B2 * 5/2006 Usami et al. .................. 235/492
2007/0182566 A1 * 8/2007 Kim et al. ..................... 340/572.8

OTHER PUBLICATIONS

Kato; "Wireless IC Device"; U.S. Appl. No. 12/339,198, filed Dec. 19, 2008.
Kato; "Wireless IC Device"; U.S. Appl. No. 11/964,185, filed Dec. 26, 2007.

* cited by examiner

*Primary Examiner* — Seung Lee
(74) *Attorney, Agent, or Firm* — Keating & Bennett, LLP

(57) ABSTRACT

An article package formed from, for example, an aluminum-evaporated laminated film includes a cut-out section, which has no aluminum-evaporated layer, in an edge. An electromagnetic-coupling module is disposed in the cut-out section. A wireless IC device is constituted by the electromagnetic-coupling module and an aluminum-evaporated layer of the package. A magnetic-field antenna of the electromagnetic-coupling module is coupled to the aluminum-evaporated layer of the package. The whole of the article package acts as a radiator of the antenna.

18 Claims, 18 Drawing Sheets

WIRELESS IC DEVICE

BACKGROUND OF THE INVENTION

1. Field of the Invention

The present invention relates to a wireless integrated circuit (IC) device applied to a radio-frequency identification (RFID) system that performs data communication in a non-contact manner using electromagnetic waves.

2. Description of the Related Art

In recent years, an RFID system that transmits information using contactless communication between a reader/writer generating induction fields and a wireless IC device being attached on an article and storing predetermined information has been being used as a merchandise management system.

FIGS. 1A and 1B illustrate an example of a contactless IC tag (wireless IC device) in which an IC tag label is attached to an IC tag antenna disclosed in Japanese Unexamined Patent Application Publication No. 2003-243918. FIG. 1A is a plan view thereof, and FIG. 1B is an enlarged cross-sectional view taken along the line A-A in FIG. 1A. The contactless IC tag antenna is constituted by two pieces of separated antenna patterns 91 and 92. The antenna patterns 91 and 92 are formed from a thin metal layer.

A label base 82b of a contactless IC tag label 82 is provided with antennas 101 and 102 on which an IC chip 85 is implemented. The antennas 101 and 102 of the contactless IC tag label 82 are attached to the antenna patterns 91 and 92 so as to be in contact therewith an anisotropic conductive adhesive 84 disposed therebetween, thereby forming a contactless IC tag 90.

A sealant film 83 is disposed on the surface of the label base 82b to prevent the IC tag label from peeling off. In such a manner, a package with an IC tag, 81, is finally formed.

A contactless IC tag and a package with the tag attached described in Japanese Unexamined Patent Application Publication No. 2003-243918 have the following problems.

(a) A step of forming an antenna is necessary because the antenna is not formed in the same step of forming a package. This leads to an increase in the duration of a manufacturing process and to an addition of elements, thereby increasing the manufacturing cost of the package.

(b) It is necessary to have a large antenna pattern to obtain sufficient radiation characteristics, which means that an IC tag cannot be attached on a small article.

(c) An IC tag is attached on the base of an article and is covered with another film, thereby resulting in the thickness of the IC-tag formed portion being increased.

SUMMARY OF THE INVENTION

In order to overcome the problems described above, preferred embodiments of the present invention provide a wireless IC device that solves the above-described problems, reduces the cost of manufacturing a package, is attachable to a small article, and includes a tag formed portion having a reduced thickness.

According to various preferred embodiments of the present invention, a wireless IC device is constructed as described below.

(1) The wireless IC device includes a high-frequency device and a radiation electrode. The high-frequency device is an electromagnetic-coupling module or a wireless IC chip. The electromagnetic-coupling module includes a wireless IC chip and a feeder circuit board in electrical communication with the wireless IC chip. The feeder circuit board is coupled to an external circuit. The radiation electrode is coupled to the high-frequency device mounted thereon. The radiation electrode is part of an article and acts as a radiator.

(2) The radiation electrode may include a conductive portion having a predetermined area. The conductive portion may include a cut-out section located at an edge. The high-frequency device may be disposed in the cut-out section. The high-frequency device may be coupled to the conductive portion within the cut-out section.

(3) The radiation electrode may include a conductive portion having a predetermined area and having a non-conductive section as part thereof. The high-frequency device may be disposed in the non-conductive section and adjacent to an edge thereof. The high-frequency device may be coupled to the conductive portion located in the vicinity of the non-conductive section.

(4) The wireless IC device may further include a loop electrode disposed in an implementation region for the high-frequency device (adjacent to an implementation field) such that a loop surface of the loop electrode is oriented in an in-plane direction of the radiation electrode, the loop electrode being coupled to the high-frequency device and being in direct electrical communication with the radiation electrode.

(5) The wireless IC device may further include a loop electrode disposed in an implementation region for the high-frequency device (adjacent to an implementation field). The loop electrode may be coupled to the high-frequency device. The loop electrode may be electromagnetically coupled to the radiation electrode with an insulating layer disposed therebetween.

(6) The wireless IC device may further include a matching electrode disposed between the implementation region for the high-frequency device and the loop electrode. The matching electrode may be configured to enable direct communication between the high-frequency device and the loop electrode.

(7) The wireless IC device may further include at least one of a resonant circuit and a matching circuit disposed in the feeder circuit board.

(8) The radiation electrode may include, for example, a metallic layer of an article package in which a sheet containing a conductive layer is formed into a bag or pack.

(9) The radiation electrode may include, for example, an electrode pattern formed on a circuit board in an electronic apparatus.

(10) The radiation electrode may include a metallic plate disposed on a back surface of a component such as a liquid crystal panel in an electronic apparatus.

According to various preferred embodiments of the present invention, the following advantages can be obtained.

(1) It is unnecessary to have a step and an additional member for producing an antenna pattern on an article, as required in the device illustrated in FIGS. 1A and 1B. Therefore, there is little increase in cost caused by the provision of a wireless IC device to an article.

The whole or part of an article can be used as a radiator. Accordingly, sufficient radiation characteristics can be obtained even when the tag is attached on a small article.

The thickness of a region where the high-frequency device is mounted on the base of an article can be reduced. Accordingly, protuberance of the high-frequency device can be suppressed and prevented, which means that the appearance of the article is not impaired.

In addition, the use of the electromagnetic coupling module enables impedance matching between the wireless IC chip and the radiation electrode to be designed within the feeder circuit board. This obviates the necessity to limit the shape and material of the radiation electrode, which means that any article can be supported.

(2) Arranging the high-frequency device in the cut-out section at an edge of the conductive portion which has a predetermined area and coupling the high-frequency device to the conductive portion within the cut-out section of the conductive portion enables the high-frequency device to be disposed so as not to protrude from the outer shape of the article and also enables the conductive portion to be effectively used as a radiator.

(3) Arranging the high-frequency device in the non-conductive section contained in the conductive portion which has a predetermined area and coupling the high-frequency device to the conductive portion being in the vicinity of the non-conductive section enables the high-frequency device to be disposed so as not to protrude from the outer shape of the article and also enables the conductive portion to be effectively used as a radiator.

(4) Providing the implementation region for the high-frequency device with the loop electrode being coupled to the high-frequency device and being in direct electrical communication with the radiation electrode such that the loop surface is orientated in the in-plane direction of the radiation electrode enables easy matching between the high-frequency device and the loop electrode, and strong coupling of the loop electrode to the radiation electrode enables high gain.

(5) Providing the implementation region for the high-frequency device with the loop electrode being coupled to the high-frequency device and being electromagnetically coupled to the radiation electrode with the insulating layer disposed therebetween enables the high-frequency device and the loop electrode to be matched easily, and the insulation between the loop electrode and the radiation electrode in terms of direct current leads to improvement in resistance to static electricity.

(6) Providing the matching electrode in between the implementation region for the high-frequency device and the loop electrode enables the matching electrode to be used as an inductor for impedance matching between the radiation electrode and the high-frequency device. This increases the flexibility in design of impedance matching, and the design can be facilitated.

(7) Providing the resonant circuit within the feeder circuit board increases frequency selectivity, thus enabling an operating frequency of the wireless IC device to be determined approximately by a self-resonant frequency. Thus, energy of signals at a frequency for use in an RFID system can be transmitted and received with a high degree of efficiency. In addition, the optimal resonant frequency can be set in consideration of the shape and size of the radiator, thus enabling improvement in the radiation characteristics of the wireless IC device.

Providing the matching circuit within the feeder circuit board enables transmission and reception of energy of signals at a frequency for use in an RFID system with a high degree of efficiency.

(8) Using, as the radiation electrode, the metallic layer of an article package in which a sheet containing a conductive layer is formed into a bag or pack enables the article package containing the metallic layer to be used without any special process. Almost all of the surface of the article package can act as a radiator, thus enabling the ID of each article to be read even when multiple articles are piled up.

(9) Using an electrode pattern formed on a circuit board in an electronic apparatus as the radiation electrode enables the circuit board included in the electronic apparatus to be used without any special process and facilitates implementation of the high-frequency device.

(10) Using a metallic plate disposed on the back surface of a component such as a liquid crystal panel in an electronic apparatus as the radiation electrode enables the component in the electronic apparatus without any special process, which means that the size and cost are not increased.

Other features, elements, characteristics and advantages of the present invention will become more apparent from the following detailed description of preferred embodiments of the present invention (with reference to the attached drawings).

DETAILED DESCRIPTION OF THE PREFERRED EMBODIMENTS

First Preferred Embodiment

Figure 1A:
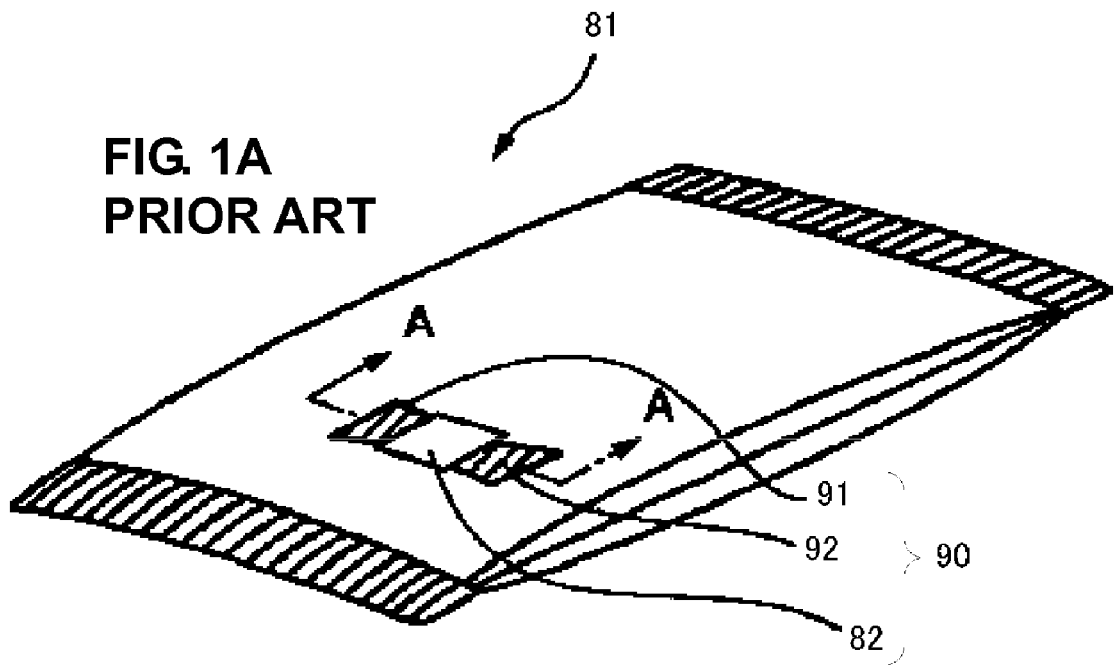
FIGS. 1A and 1B illustrate a known wireless IC device shown in Japanese Unexamined Patent Application Publication No. 2003-243918.
Figure 1B:
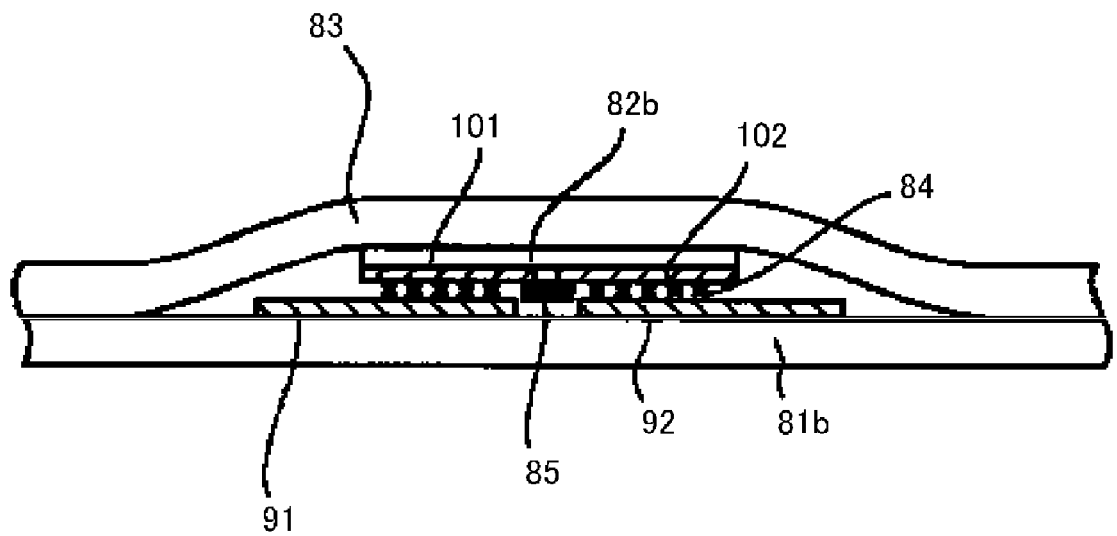
Figure 2:
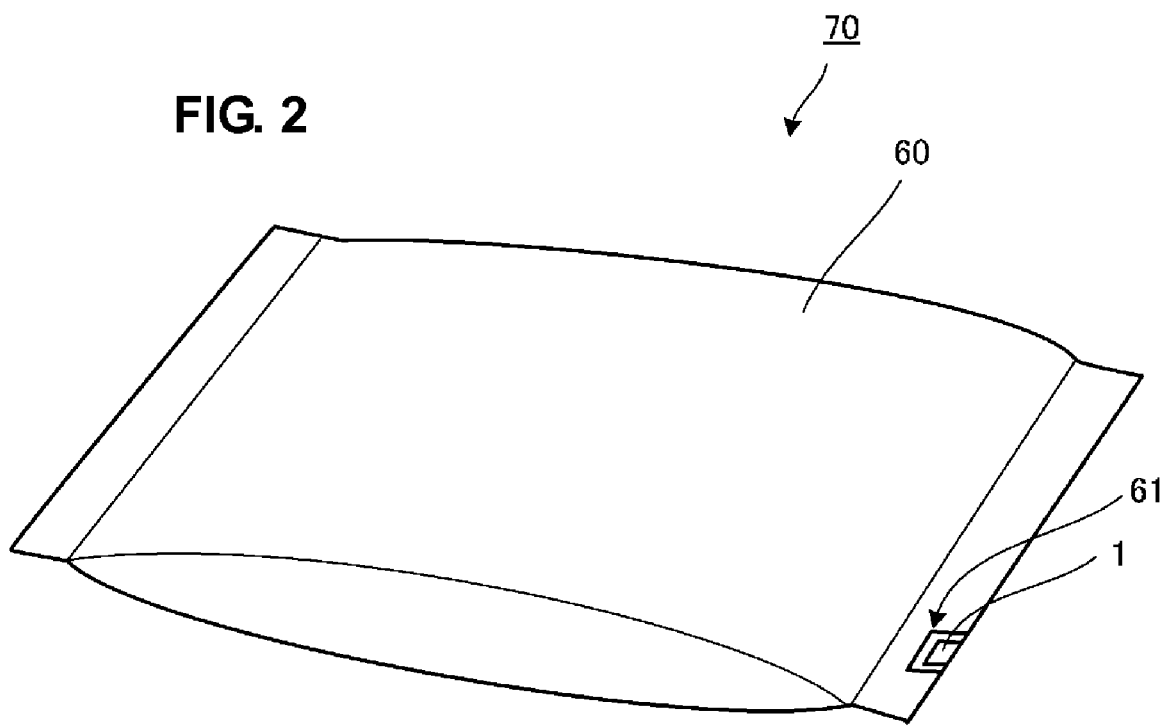
FIG. 2 illustrates an article and a wireless IC device attached thereon according to a first preferred embodiment of the present invention.

FIG. 2 is an external perspective view of an article and a wireless IC device attached thereon according to a first preferred embodiment of the present invention. An article 70 can be, for example, a bag of snack food, such as potato chips. An article package 60 preferably is a package in which an aluminum-evaporated laminated film is formed into a bag.

The article package 60 has a cut-out section (a portion that is not covered with an aluminum-evaporation film) 61 preferably located at an edge. An electromagnetic-coupling module 1 is disposed in the cut-out section 61.

Figure 3A:
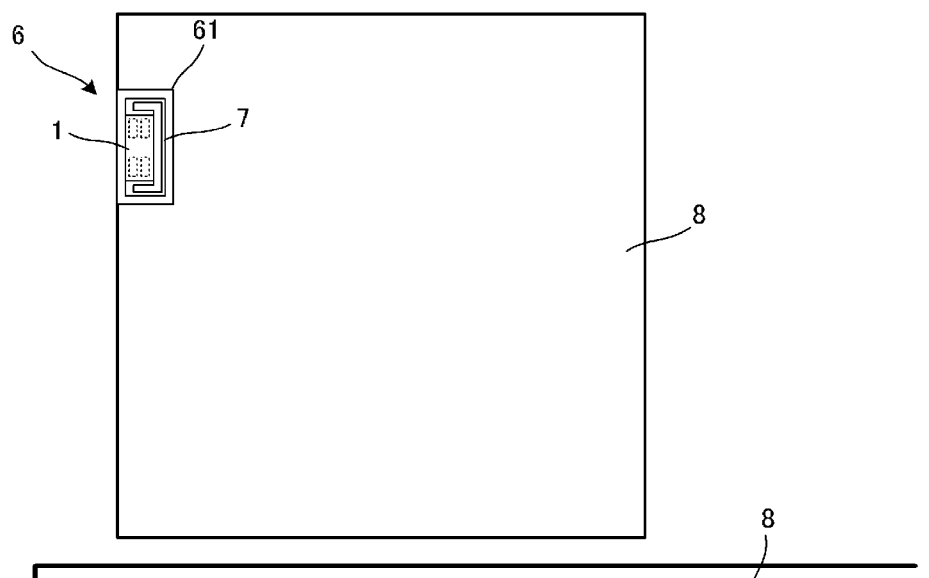
FIGS. 3A and 3B illustrate the wireless IC device, showing only component parts of the article illustrated in FIG. 2.
Figure 3B:
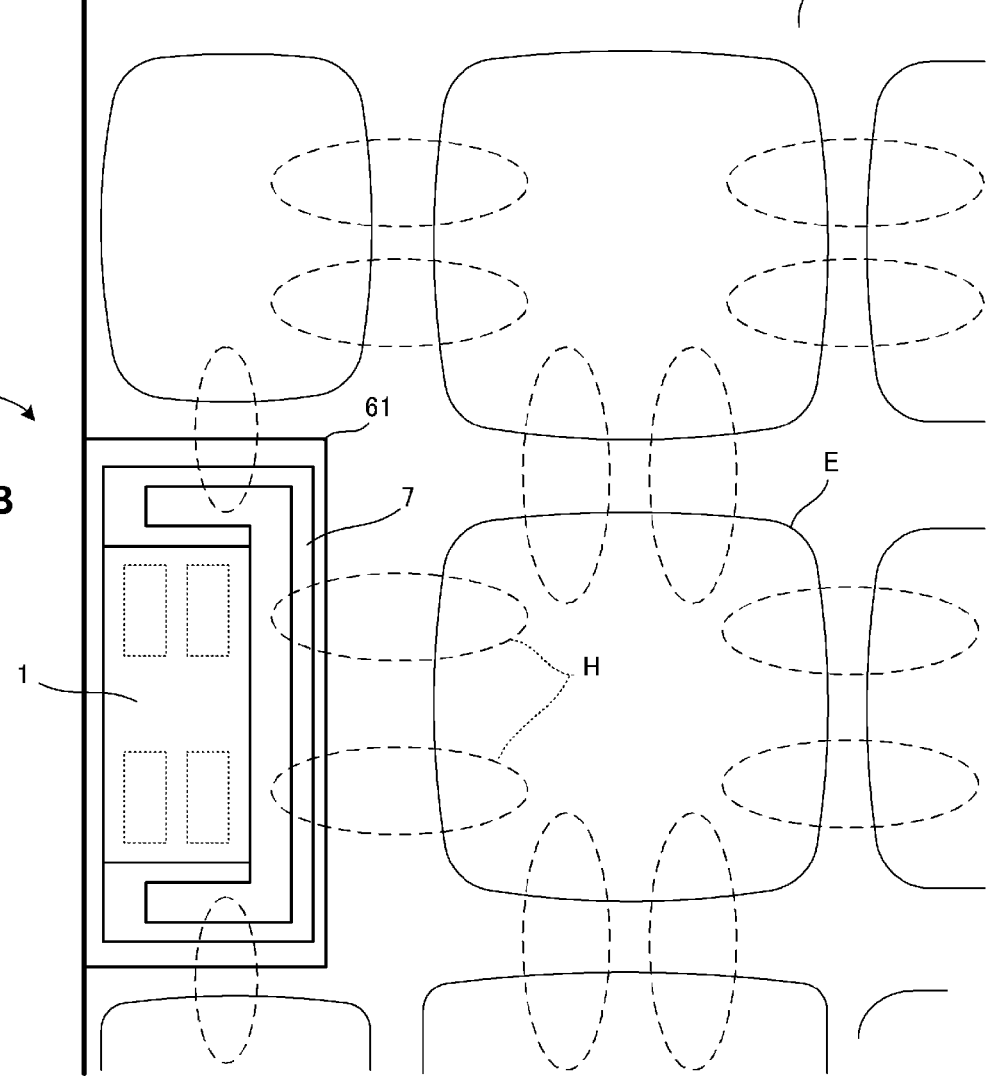

FIGS. 3A and 3B illustrate a structure of a wireless IC device, showing only component parts of the article 70 illustrated in FIG. 2. In FIGS. 3A and 3B, a radiation electrode 8 corresponds to an aluminum-evaporated layer of the aluminum-evaporated laminated film of the article package 60. A loop electrode 7 is disposed within the cut-out section (a portion where the electrode is not formed) 61 of the radiation electrode 8. The electromagnetic-coupling module 1 is implemented so as to be coupled to the loop electrode 7. The loop electrode 7 is patterned when aluminum is evaporated to form the aluminum-evaporated laminated film. Alternatively, the loop electrode 7 may be formed by producing a conductor pattern by printing in a step different from the aluminum evaporation.

FIG. 3B schematically illustrates an example of an electromagnetic-field distribution occurring in the radiation electrode 8 when the loop electrode 7 acts as a transmitting antenna. In the drawing, the broken lines represent loops of a magnetic field H, and the solid lines represent loops of an electric field E. The loop electrode 7 acts as a magnetic-field antenna. A magnetic field H generated by the loop electrode 7 crosses the radiation electrode 8 at a substantially right angle, thus inducing an electric field E. This electric-field loop induces a magnetic-field loop, and they link together, thus expanding the electromagnetic-field distribution.

In the foregoing example, the loop electrode 7 acts as a transmitting antenna. However, the loop electrode 7 can act as a receiving antenna. Also in this case, high gain can be obtained similarly because of reversibility of an antenna.

When multiple articles are piled up, if each article includes a conductive portion having a predetermined area and acting as a radiation electrode, as described above, the induced electromagnetic fields link together between the articles, thus expanding. Accordingly, even (or rather especially) when multiple articles are piled up, the wireless IC devices can operate as a high-gain device. For example, when an antenna of a reader/writer is positioned in close vicinity to part of a pile of bags of potato chips, the IDs of all of the pile of bags of potato chips can be read.

The electromagnetic-coupling module 1 illustrated in FIGS. 3A and 3B can include a wireless IC chip and a feeder circuit board, which will be described below. In the case where the feeder circuit board is used, two electrodes of the feeder circuit board are electromagnetically coupled to both terminals of the loop electrode 7. The electromagnetic-coupling module 1 can be replaced by a single wireless IC chip. In this case, two electrodes of the wireless IC chip are directly connected to both terminals of the loop electrode 7. In either of these two cases, the loop electrode 7 is separated from the radiation electrode 8 in terms of direct current, so it is advantageous that the wireless IC device has high resistance to static electricity.

The loop electrode 7 has any shape as long as the loop electrode 7 is disposed so as to couple input and output terminals of the electromagnetic-coupling module 1 together.

Second Preferred Embodiment

Figure 4:
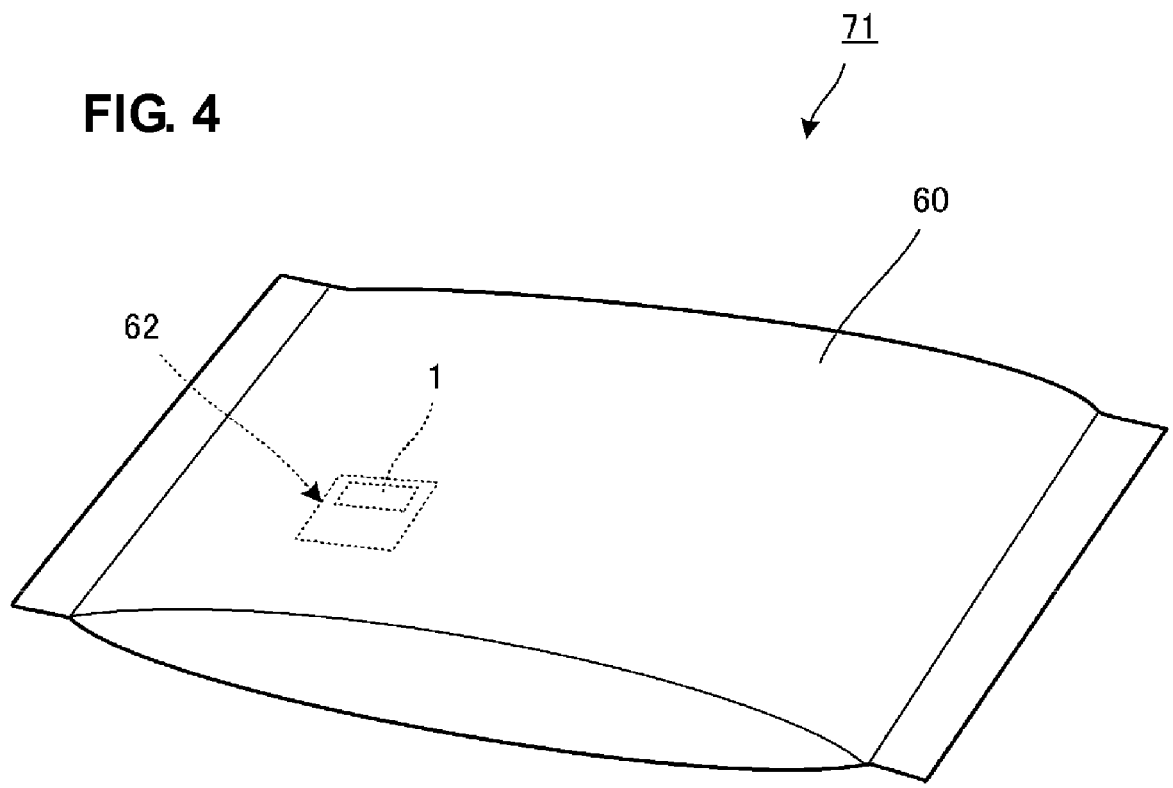
FIG. 4 illustrates an article and a wireless IC device attached thereon according to a second preferred embodiment of the present invention.

FIG. 4 is an external perspective view of an article and a wireless IC device attached thereon according to a second preferred embodiment. An article 71 can be, for example, a bag of snack food. An article package 60 preferably is a package in which an aluminum-evaporated laminated film is formed into a bag.

In an example illustrated in FIG. 2, the electromagnetic-coupling module is arranged in an edge of the article package. In an example illustrated in FIG. 4, an electromagnetic-coupling module 1 is disposed inside the article package 60 and away from the edge of the article package 60. The article package 60 is formed from an aluminum-evaporated laminated film having a non-conductive section 62 as part thereof. The non-conductive section 62 is not covered with an aluminum-evaporated film. The electromagnetic-coupling module 1 is arranged within the non-conductive section 62 and positioned adjacent to an edge thereof.

Figure 5:
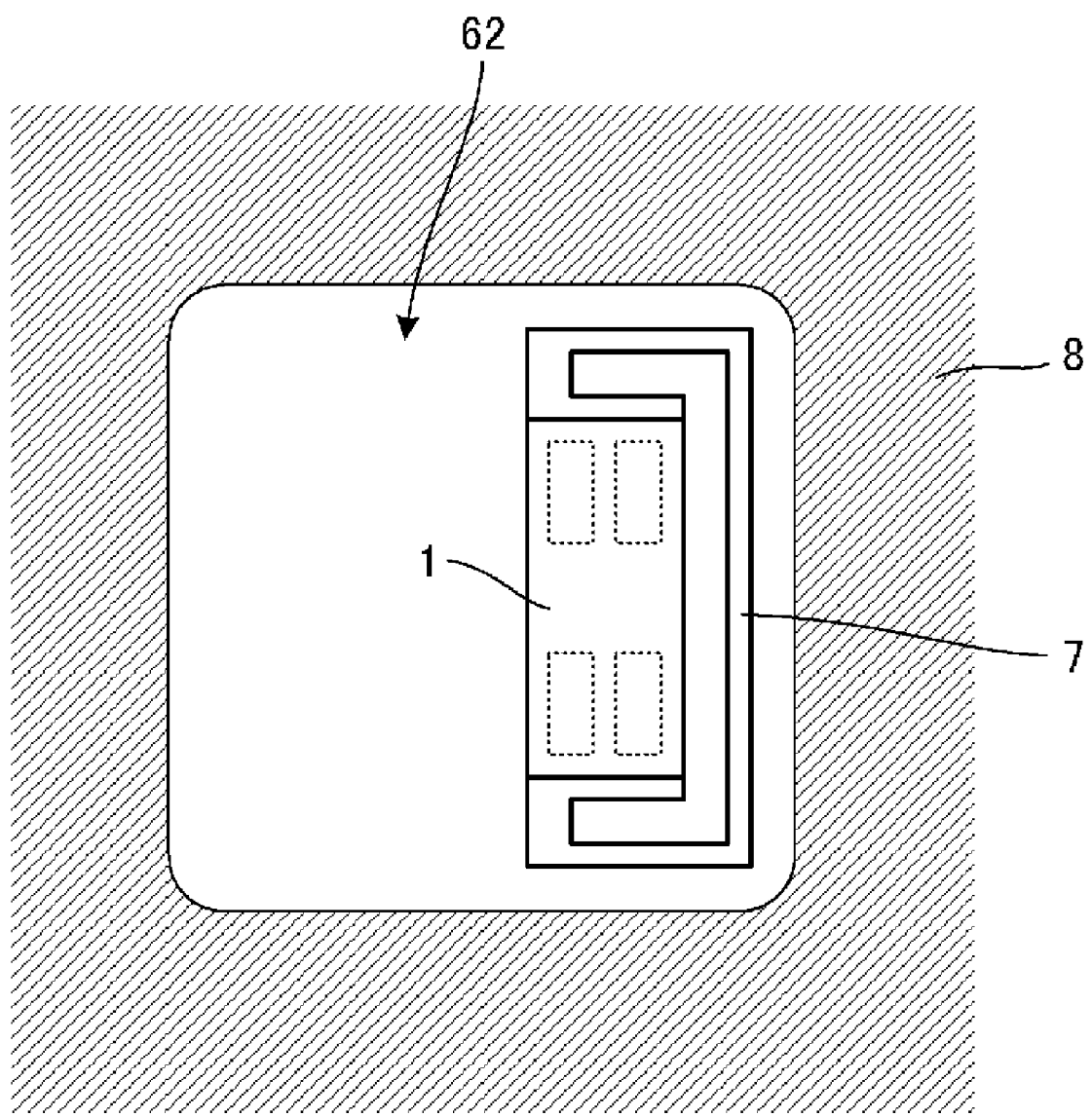
FIG. 5 illustrates the wireless IC device, showing only component parts of the article illustrated in FIG. 3.

FIG. 5 illustrates a structure of an implementation region for the electromagnetic-coupling module 1 illustrated in FIG. 4. In FIG. 5, the structure of a loop electrode 7 and that of the electromagnetic-coupling module 1 are substantially the same as those in the first preferred embodiment illustrated in FIGS. 3A and 3B. A radiation electrode 8 corresponds to an aluminum-evaporated layer of the aluminum-evaporated laminated film of the article package 60. The loop electrode 7 and the electromagnetic-coupling module 1 are arranged within the non-conductive section 62 such that the loop electrode 7 is adjacent to three sides of the radiation electrode 8.

The loop electrode 7 acts as a magnetic-field antenna and is coupled to the radiation electrode 8. The radiation electrode 8 thus acts as a radiator of the antenna by substantially the same action in FIGS. 3A and 3B.

If the loop electrode 7 and the electromagnetic-coupling module 1 are disposed within the non-conductive section 62 having substantially the same size as that of the area occupied by the loop electrode 7 and the electromagnetic-coupling module 1, the magnetic field of the loop electrode 7 is coupled to the radiation electrode 8 at the four sides, and the electromagnetic field induced in the radiation electrode 8 is cancelled, thus resulting in a gain reduction. To avoid this, it is important that the size of the non-conductive section 62 is sufficiently larger than that of the area occupied by the loop electrode 7 and the electromagnetic-coupling module 1 and one, two, or three sides of the loop electrode 7 are adjacent to the radiation electrode 8.

Third Preferred Embodiment

Figure 6A:
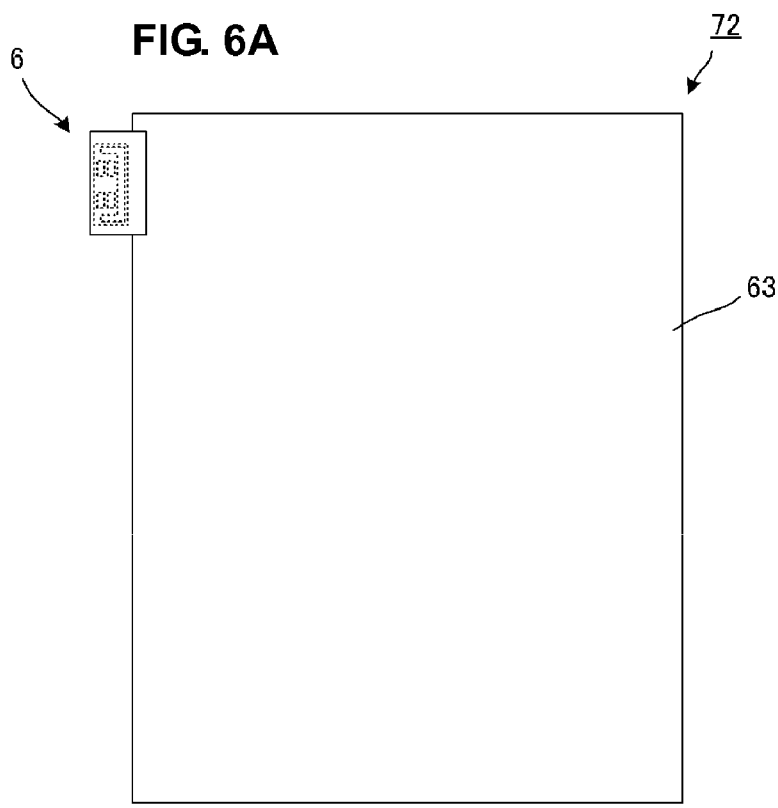
FIGS. 6A and 6B illustrate an article and a wireless IC device attached thereon according to a third preferred embodiment according to the present invention.
Figure 6B:
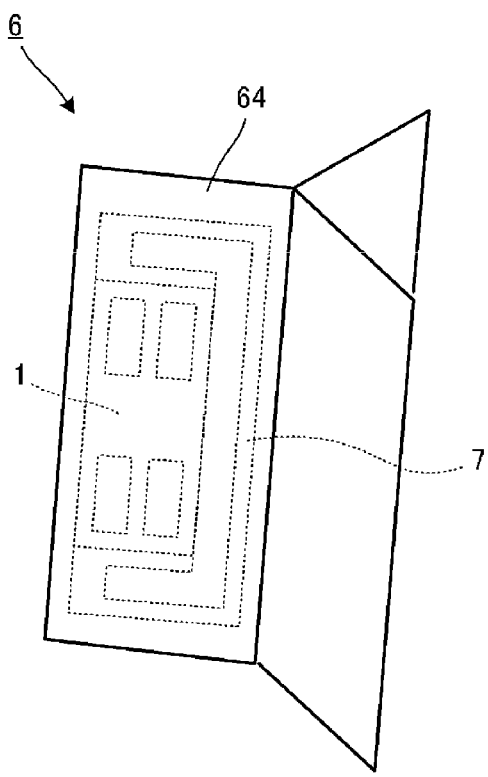

FIG. 6B illustrates a structure of a main portion of a wireless IC device according to a third preferred embodiment. FIG. 6A is an external view of an article on which the wireless IC device is attached. In FIG. 6A, an article 72 includes a substantially planar metallic body 63 and a wireless-IC-device main portion 6 attached thereon. The substantially planar metallic body 63 is a plate-shaped or sheet-shaped article having a metallic layer contained therein or a metallic plate itself.

The wireless-IC-device main portion 6 is shaped like a tab index, as illustrated in FIG. 6B, and includes an insulating sheet 64. The insulating sheet 64 includes an adhesive layer on the inside surface and sandwiches a loop electrode 7 and an electromagnetic-coupling module 1. The structure of the loop electrode 7 and that of the electromagnetic-coupling module 1 are substantially the same as those illustrated in FIGS. 3A and 3B.

The wireless-IC-device main portion 6 is attached on the substantially planar metallic body 63 illustrated in FIG. 6A such that the loop electrode 7 is adjacent to an edge of the substantially planar metallic body 63, as in the case of attaching a tab index.

Even when the conductive portion has no cut-out section in its edge, as described above, disposing the loop electrode 7 of the wireless-IC-device main portion 6 adjacent to the edge of the substantially planar metallic body 63 enables the loop electrode 7 and the substantially planar metallic body 63 (a conductive portion acting as a radiation electrode) to be coupled together and the substantially planar metallic body 63 to act as a radiator of the antenna.

Fourth Preferred Embodiment

A wireless IC device according to a fourth preferred embodiment will now be described with reference to FIGS. 7 and 8A and 8B. The wireless IC device according to the fourth preferred embodiment preferably is applied to a recording medium that has a metallic film, such as a digital versatile disc (DVD).

Figure 7:
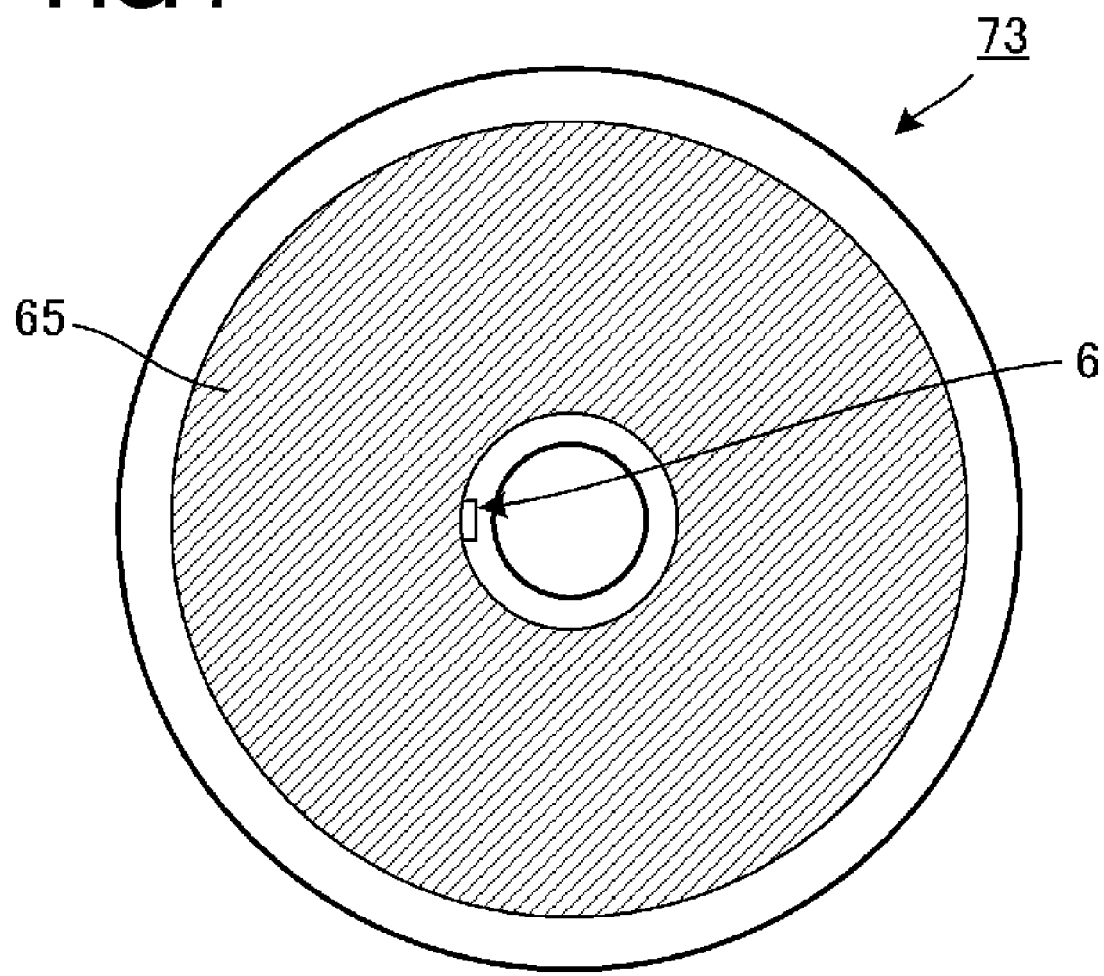
FIG. 7 illustrates an article and a wireless IC device attached thereon according to a fourth preferred embodiment of the present invention.

FIG. 7 is a plan view of a DVD. FIG. 8A is a cross-sectional view taken along a substantially center line that passes through a region where a wireless-IC-device main portion 6 is formed. FIG. 8B is a partial enlarged plan view of the wireless-IC-device main portion 6. In a cross-sectional view illustrated in FIG. 8A, the dimension of the thickness direction is exaggerated for purposes of illustration.

Figure 8A:
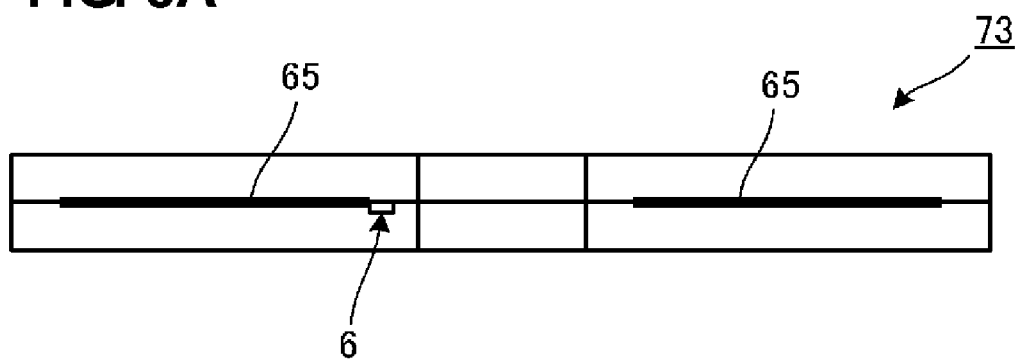
FIGS. 8A and 8B illustrate a cross-sectional view taken along a substantially center line that passes through a main portion of the wireless IC device and a partial enlarged plan view of the main portion of the wireless IC device, respectively.

As illustrated in FIGS. 7 and 8A, a DVD 73 includes two disc-shaped elements bonded together. One of these elements includes a metallic film 65. The wireless-IC-device main portion 6 is disposed at a portion of an inner edge of the metallic film 65.

Figure 8B:
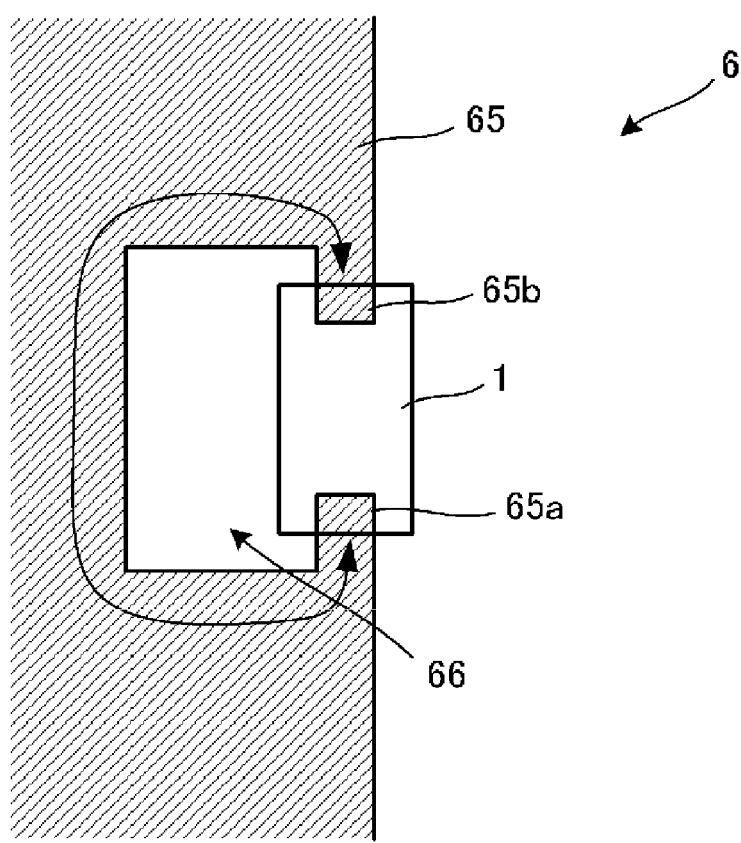

As illustrated in FIG. 8B, a C-shaped cut-out section 66 is disposed at a portion of the inner edge of the metallic film 65. The cut-out section 66 is a cut-out section of the metallic film pattern, not of the disc. The electromagnetic-coupling module 1 is arranged such that two terminals thereof face two opposing tips defined by the cut-out section 66. The inner edge surrounding the C-shaped cut-out section 66 (indicated by the arrows in FIG. 8B) acts as a loop electrode.

Fifth Preferred Embodiment

Figure 9A:
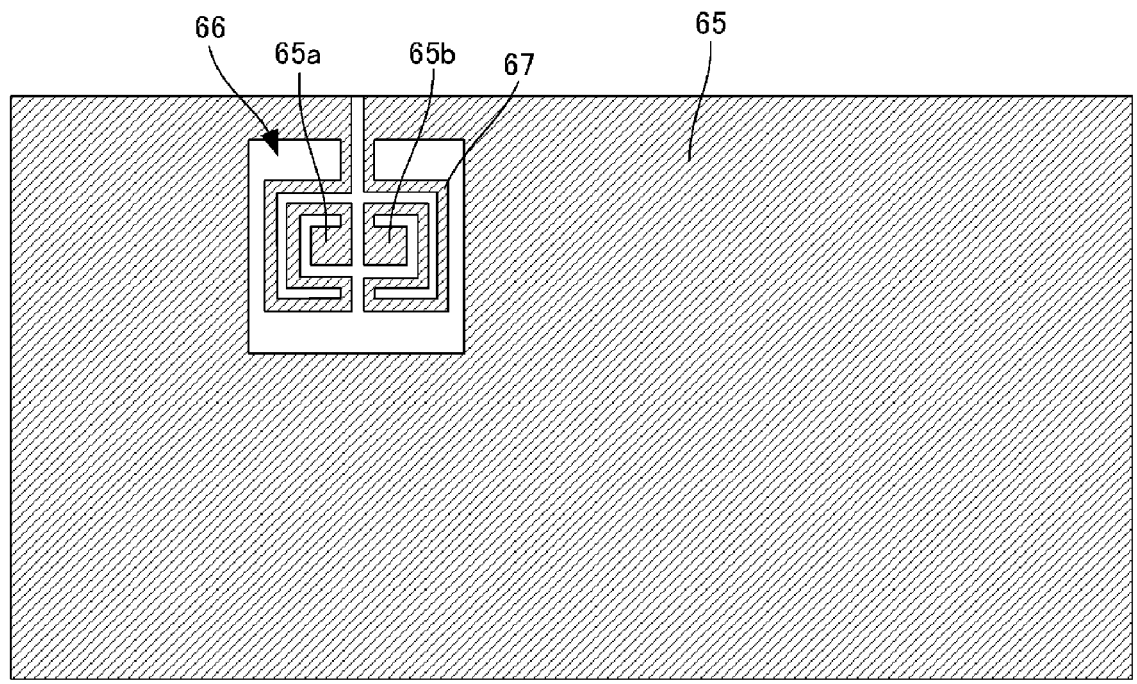
FIGS. 9A and 9B illustrate a wireless IC device according to a fifth preferred embodiment of the present invention.
Figure 9B:
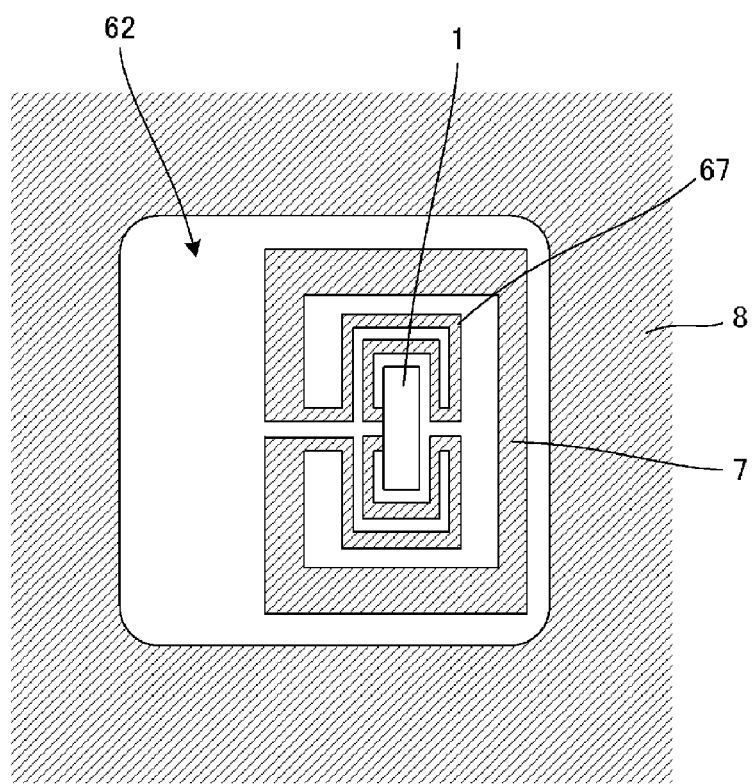

FIGS. 9A and 9B illustrate structures of two wireless IC devices according to a fifth preferred embodiment, respectively. Each of the wireless IC devices according to the fifth preferred embodiment includes a matching electrode disposed between an implementation region for a high-frequency device and a loop electrode, the matching electrode enabling direct communication between the high-frequency device and the loop electrode.

In FIG. 9A, a metallic film 65 has the shape of a sheet or a plate and acts as a radiation electrode. The metallic film 65 has a cut-out section 66 as part thereof, thus causing a region extending so as to surround the inner edge of the cut-out section 66 to act as a loop electrode.

A meandering matching electrode 67 and metallic-film end sections 65a and 65b being an implementation region for a high-frequency device (electromagnetic-coupling module or wireless IC chip) are formed within the cut-out section 66.

The provision of a matching circuit realized by the matching electrode 67 allows a wireless IC chip to be directly implemented on the metallic-film end sections 65a and 65b.

In FIG. 9B, a radiation electrode 8 includes a non-conductive section 62. The matching electrode 67, a loop electrode 7, and an electromagnetic-coupling module 1 are arranged within the non-conductive section 62 such that the loop electrode 7 is adjacent to three sides of the radiation electrode 8. The structure of the matching electrode 67 and that of the implementation for the electromagnetic-coupling module 1 preferably are substantially the same as those in FIG. 9A.

The loop electrode 7 acts as a magnetic-field antenna and is coupled to the radiation electrode 8. The radiation electrode 8 thus acts as a radiator of the antenna by substantially the same action in FIGS. 3A and 3B.

Each of the metallic film 65 illustrated in FIG. 9A and the radiation electrode 8 illustrated in FIG. 9B may be a solid electrode on a circuit board within, for example, a mobile telephone terminal.

Sixth Preferred Embodiment

Figure 10:
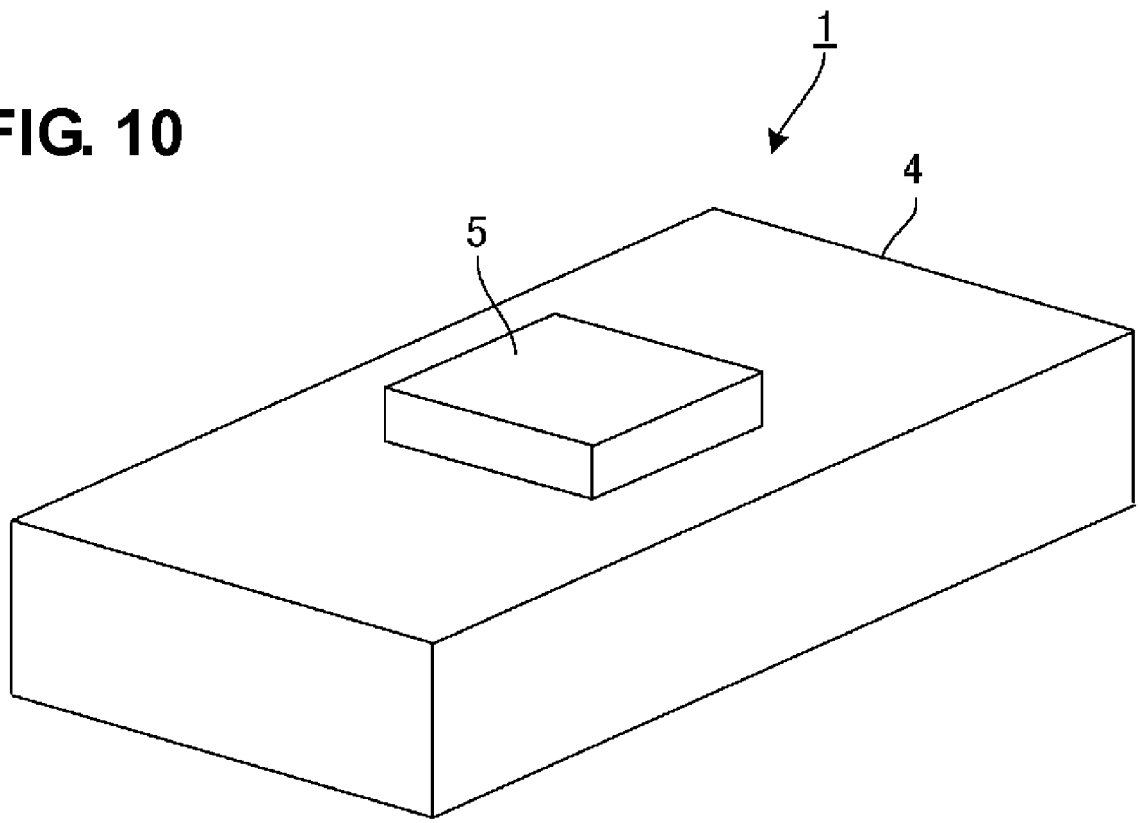
FIG. 10 is an external perspective view of an electromagnetic-coupling module for use in a wireless IC device according to a sixth preferred embodiment of the present invention.

FIG. 10 is an external perspective view of an electromagnetic-coupling module 1 for use in a wireless IC device according to a sixth preferred embodiment. This electromagnetic-coupling module 1 is applicable to a wireless IC device according to other preferred embodiments. The electromagnetic-coupling module 1 includes a wireless IC chip 5 and a feeder circuit board 4. The feeder circuit board 4 performs impedance matching between a metallic film 65 acting as a radiation electrode and the wireless IC chip 5 and also acts as a resonant circuit.

Figure 11:
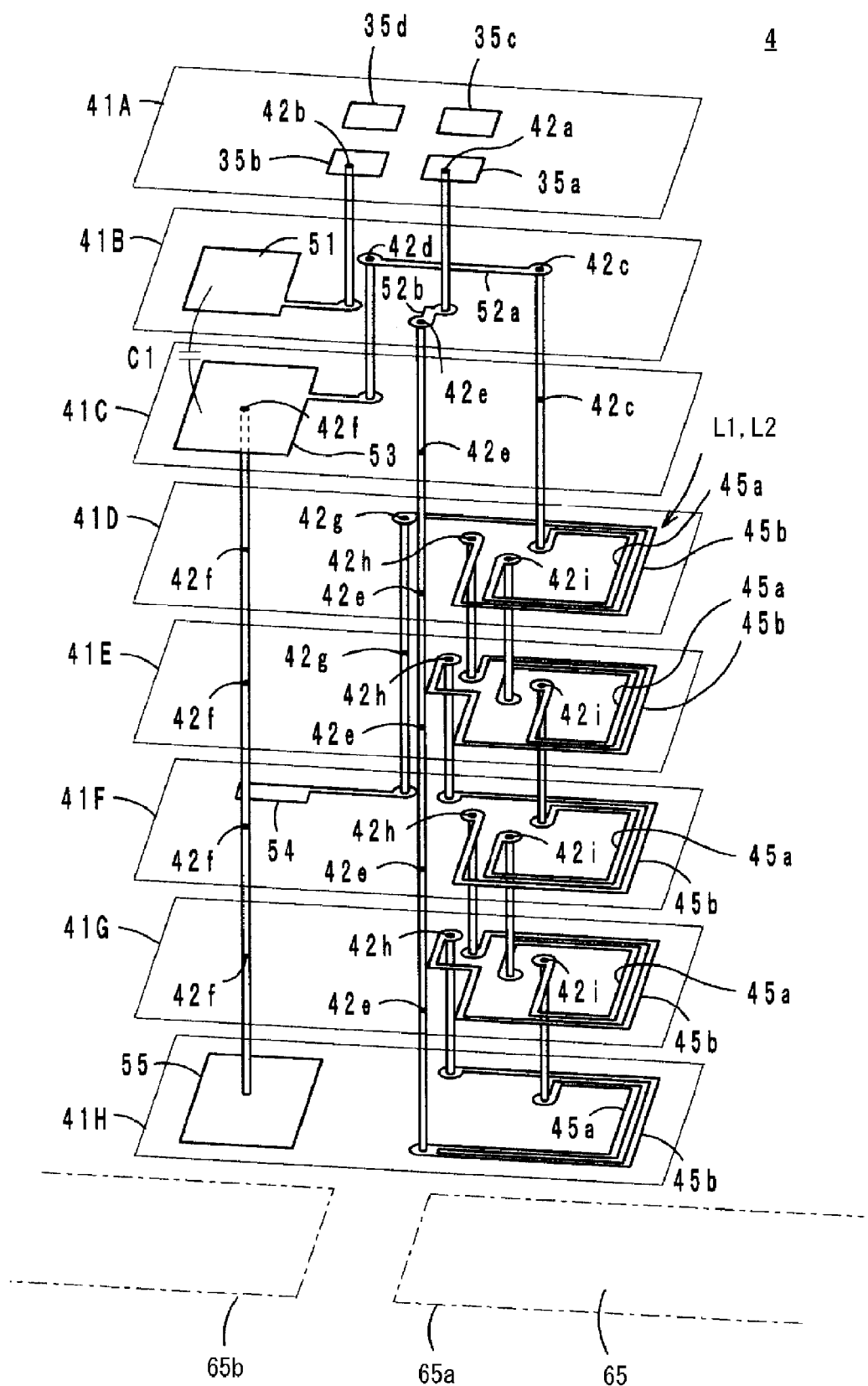
FIG. 11 is an exploded view that illustrates an internal structure of a feeder circuit board of the electromagnetic-coupling module.

FIG. 11 is an exploded view that illustrates an internal structure of the feeder circuit board 4. The feeder circuit board 4 is a multilayer board that includes a plurality of dielectric layers, each having an electrode pattern formed thereon. An uppermost dielectric layer 41A includes lands 35a to 35d for implementation of a wireless IC chip. A dielectric layer 41B includes a capacitor electrode 51 in electrical communication with the wireless IC chip implementation land 35b. A dielectric layer 41C includes a capacitor electrode 53. A capacitor C1 is formed between the capacitor electrodes 51 and 53. Each of dielectric layers 41D to 41H includes inductor electrodes 45a and 45b. These inductor electrodes 45a and 45b formed over the plurality of layers constitute inductors L1 and L2. The inductors L1 and L2 preferably have a double-spiral shape and are inductively coupled to each other strongly. The dielectric layer 41F includes a capacitor electrode 54 in electrical communication with the inductor L1. The dielectric layer 41H includes a capacitor electrode 55 in electrical communication with the capacitor electrode 53. The capacitor electrode 54 forms a capacitor between the two capacitor electrodes 53 and 55. The electrodes of the dielectric layers electrically communicate with each other through via holes 42a to 42i.

The capacitor electrode 55 faces the metallic-film end section 65b defined by the cut-out section of the metallic film 65 illustrated in FIG. 8 and constitutes a capacitor therebetween. The inductor electrodes 45a and 45b are electromagnetically coupled to the metallic-film end section 65a, which face the inductor electrodes 45a and 45b.

Figure 12:
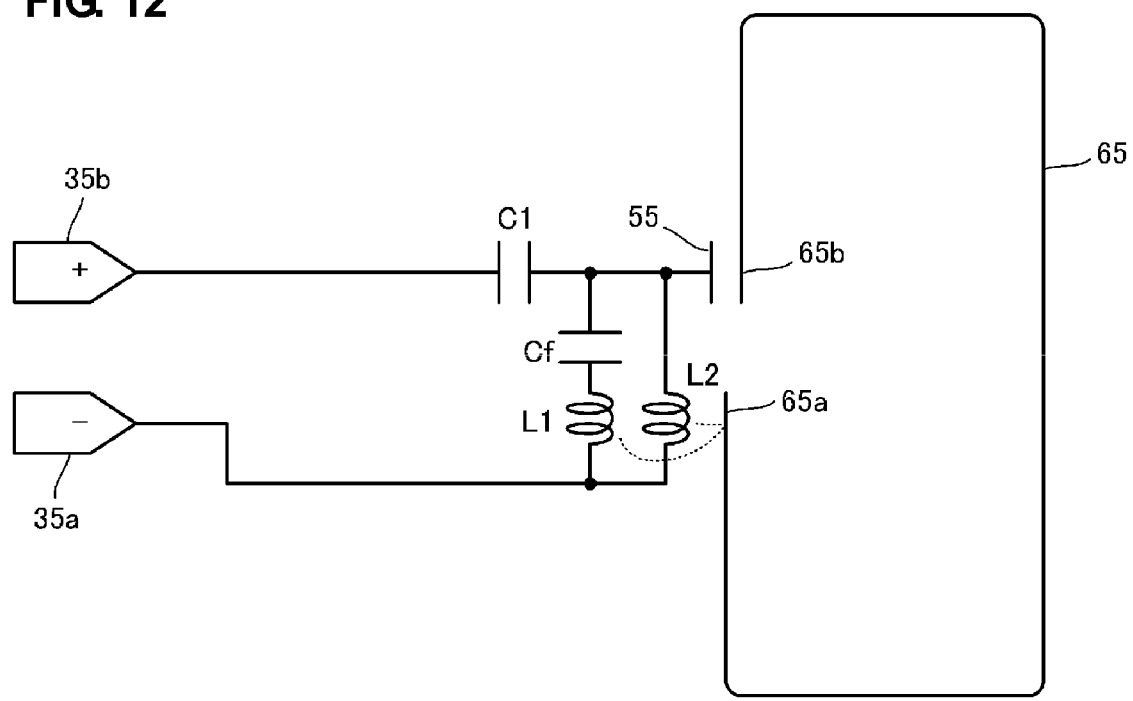
FIG. 12 is an equivalent circuit diagram that includes the feeder circuit board and a cut-out section of a metallic layer.

FIG. 12 is an equivalent circuit diagram that includes the feeder circuit board and the cut-out section of the metallic layer illustrated in FIG. 11. In FIG. 12, the capacitor C1 corresponds to a capacitor defined between the capacitor electrodes 51 and 53 illustrated in FIG. 11. A capacitor Cf corresponds to a capacitor defined between the capacitor electrode 54 and the capacitor electrodes 53 and 55 illustrated in FIG. 11. The inductors L1 and L2 preferably are defined by the inductor electrodes 45a and 45b illustrated in FIG. 11. The metallic film 65 illustrated in FIG. 12 is a loop extending so as to surround the inner edge of the cut-out section 66 illustrated in FIG. 8. The capacitor electrode 55 is capacitively coupled to the end section 65b, and the other end section 65a is electromagnetically coupled to the inductors L1 and L2. Therefore, the loop extending so as to surround the inner edge of the cut-out section 66 acts as a loop electrode.

In the fourth preferred embodiment, the loop extending so as to surround the inner edge of the cut-out section of the metallic film acts as a loop electrode. However, the loop electrode may be formed within the cut-out section, as illustrated in, for example, FIGS. 3A and 3B, and the electromagnetic-coupling module 1 constituted by the wireless IC chip 5 and the feeder circuit board 4 is implemented to the loop electrode. In this case, the loop electrode is coupled to the metallic film 65, and the metallic film 65 acts as a radiator.

In the feeder circuit board 4, a resonance frequency is determined in a resonant circuit constituted by the inductors L1 and L2 and its stray capacitance. The frequency of a signal transmitted from the radiation electrode is substantially determined by the self-resonant frequency of the resonant circuit.

The electromagnetic-coupling module 1 constituted by the feeder circuit board 4 and the wireless IC chip 5 mounted thereon receives a high-frequency signal (for example, in the ultra-high-frequency (UHF) band) transmitted from a reader/writher (not shown) via the radiation electrode, resonates the resonant circuit in the feeder circuit board 4, and supplies only a reception signal in a desired frequency band to the wireless IC chip 5. Then, a predetermined energy is extracted from the reception signal. By use of this energy as a driving source, information stored in the wireless IC chip 5 is matched to a predetermined frequency by the resonant circuit, and the information is then transmitted to the radiation electrode. The information is transmitted (transferred) from the radiation electrode to the reader/writer.

As described above, providing the resonant circuit within the feeder circuit board increases frequency selectivity, thus enabling the operating frequency of the wireless IC device to be determined approximately by the self-resonant frequency. Thus, energy of signals at a frequency for use in an RFID system can be transmitted and received with a high degree of efficiency. In addition, the optimal resonant frequency can be set in consideration of the shape and size of the radiator, thus enabling improvement in the radiation characteristics of the wireless IC device.

Providing the matching circuit within the feeder circuit board enables transmission and reception of energy of signals at a frequency for use in an RFID system with a high degree of efficiency.

Seventh Preferred Embodiment

Figure 13:
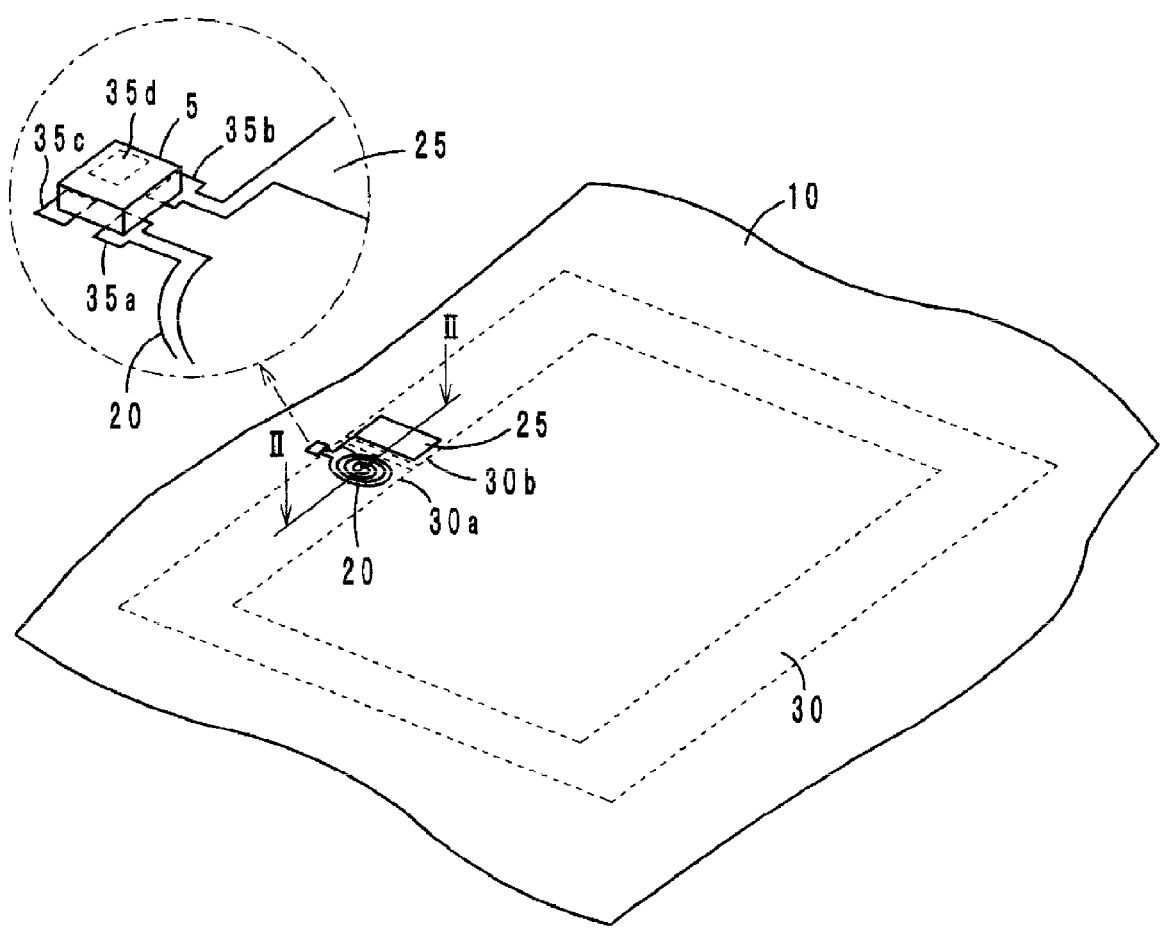
FIG. 13 illustrates an article and a wireless IC device attached thereon according to a seventh preferred embodiment of the present invention.
Figure 14:
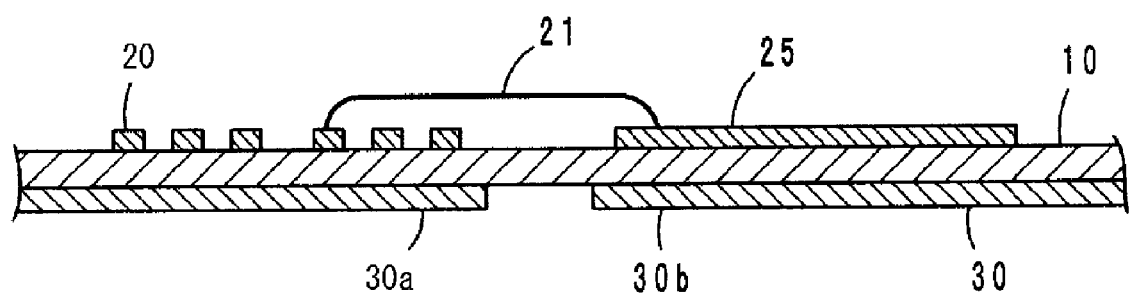
FIG. 14 is a cross-sectional view of a main portion of the wireless IC device.

FIG. 13 is a perspective view that illustrates a structure of a main portion of a wireless IC device according to a seventh preferred embodiment. FIG. 14 is a partial enlarged cross-sectional view thereof.

In FIG. 13, a base 10 is a base of an article for mounting the wireless IC device and can be, for example, an aluminum-evaporated laminated film. A loop electrode 30 is formed on an aluminum-evaporated layer of the base 10. The loop electrode 30 has an opening at a predetermined position corresponding to a cut-out section described in the first preferred embodiment or a non-conductive section described in the second preferred embodiment and includes two ends 30a and 30b formed by the opening. An inductor electrode 20 and a capacitor electrode 25 are disposed on the ends 30a and 30b, respectively, with an insulating layer arranged therebetween. The inductor electrode 20 has a spiral shape and, as described below, its inner edge is connected to the capacitor electrode 25.

As illustrated in an enlarged view in FIG. 13, a wireless IC chip 5 is mounted on an end of the inductor electrode 20 and an end of the capacitor electrode 25. More specifically, a wireless IC chip implementation land 35a is disposed on the end of the inductor electrode 20, and a wireless IC chip implementation land 35b is disposed on the end of the capacitor electrode 25. In addition, wireless IC chip implementation lands 35c and 35d are formed, thereby mounting the wireless IC chip 5.

FIG. 14 is a cross-sectional view taken along the line II-II in FIG. 13. As illustrated in FIG. 14, the inductor electrode 20 faces the end 30a of the loop electrode 30. The inner edge of the inductor electrode 20 and the capacitor electrode 25 illustrated in FIG. 13 are connected with a wire 21.

As described above, a capacitor and an inductor for impedance matching and adjustment of a resonant frequency can be disposed on the base 10 of the article, and the wireless IC chip 5 can be directly implemented thereon.

Eighth Preferred Embodiment

Figure 15:
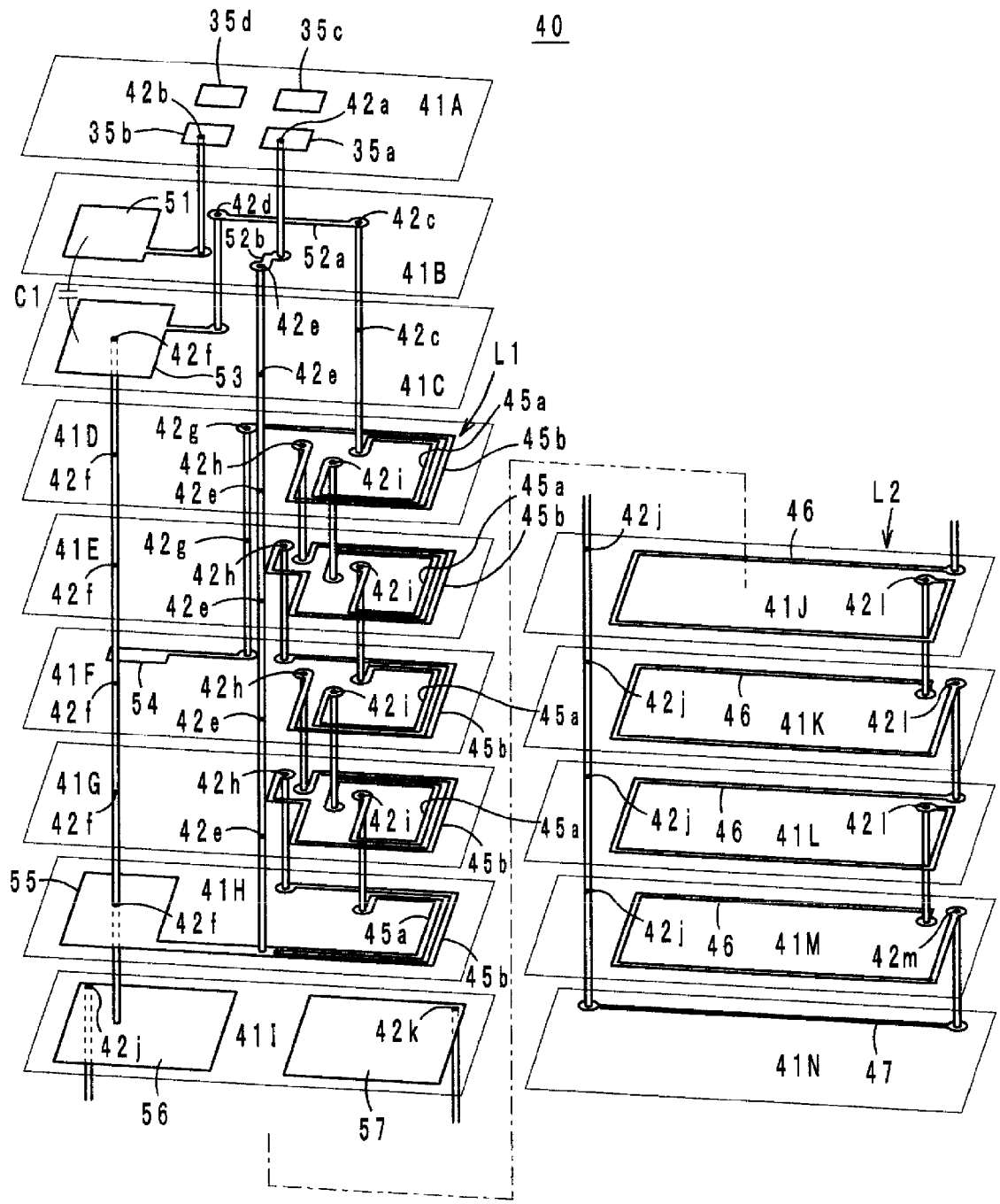
FIG. 15 is an exploded perspective view of a feeder circuit board of a wireless IC device according to an eighth preferred embodiment of the present invention.
Figure 16:
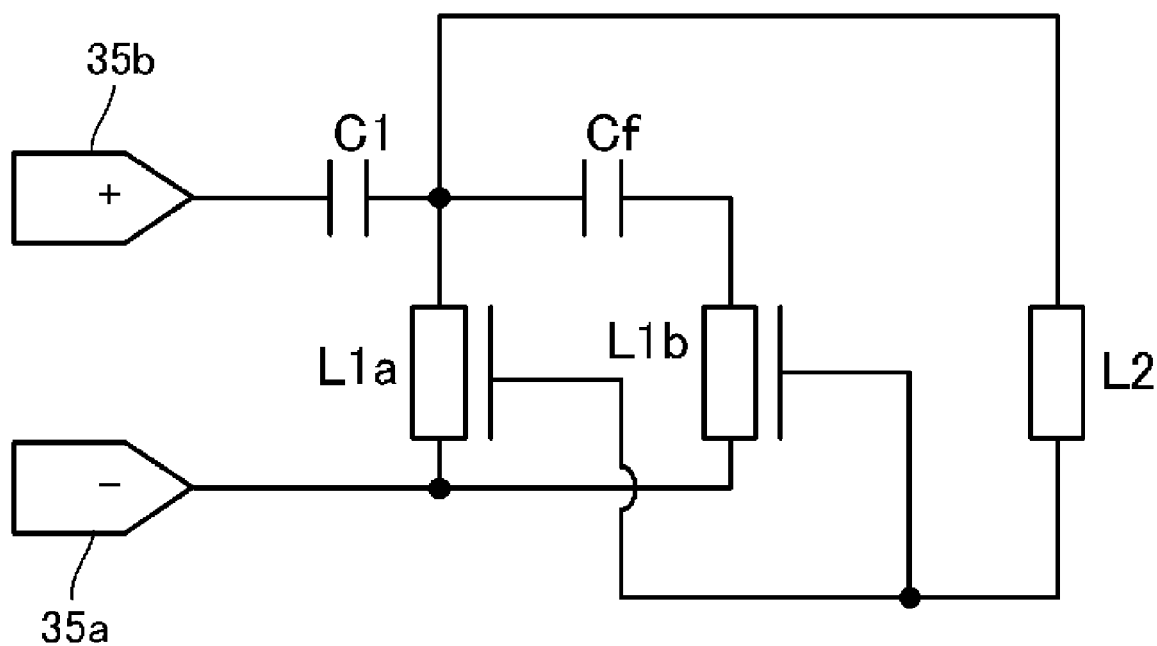
FIG. 16 is an equivalent circuit diagram of a main portion of the wireless IC device.

FIG. 15 is an exploded perspective view of a feeder circuit board 40 of a wireless IC device according to an eighth preferred embodiment. FIG. 16 is an equivalent circuit diagram thereof.

The feeder circuit board 40 is a multilayer board that includes a plurality of dielectric layers, each having an electrode pattern formed thereon. An uppermost dielectric layer 41A includes lands 35a to 35d for implementation of a wireless IC chip. A dielectric layer 41B includes a capacitor electrode 51 in electrical communication with the wireless IC chip implementation land 35b. A dielectric layer 41C includes a capacitor electrode 53. A capacitor C1 is formed between the capacitor electrodes 51 and 53. Each of dielectric layers 41D to 41H includes inductor electrodes 45a and 45b. These inductor electrodes 45a and 45b formed over the plurality of layers constitute an inductor L1 having a double-spiral shape. The dielectric layer 41F includes a capacitor electrode 54 in electrical communication with the inductor L1. The dielectric layer 41H includes a capacitor electrode 55 in electrical communication with the capacitor electrode 53. The capacitor electrode 54 forms a capacitor between the two capacitor electrodes 53 and 55 (56).

A dielectric layer 41I includes capacitor electrodes 56 and 57. The capacitor electrode 56 electrically communicates with the capacitor electrodes 53 and 55. The capacitor electrode 57 is electromagnetically coupled to the inductor electrodes 45a and 45b.

Each of dielectric layers 41J to 41M includes an inductor electrode 46, and a dielectric layer 41N includes an inductor electrode 47. The inductor electrodes 46 and 47 constitute a loop electrode L2 having a number of turns of wire. The electrodes of the dielectric layers electrically communicate with each other through via holes 42a to 42m.

That is, the feeder circuit board 40 is the one in which a loop electrode is added to the feeder circuit board 4 illustrated in FIG. 11. As a result, a wireless IC device is constructed merely by mounting, on an article, an electromagnetic-coupling module formed by implementing a wireless IC chip to the feeder circuit board 40, thus obviating the necessity to provide the article with the loop electrode.

In FIG. 16, the capacitor C1 corresponds to a capacitor defined between the capacitor electrodes 51 and 53 illustrated in FIG. 15. A capacitor Cf corresponds to a capacitor defined between the capacitor electrode 54 and the capacitor electrodes 53 and 55 illustrated in FIG. 15. The inductors L1a and L1b are formed by the inductor electrodes 45a and 45b illustrated in FIG. 15, respectively. The inductor L2 is preferably defined by the inductor electrodes 46 and 47 illustrated in FIG. 15.

Ninth Preferred Embodiment

Figure 17A:
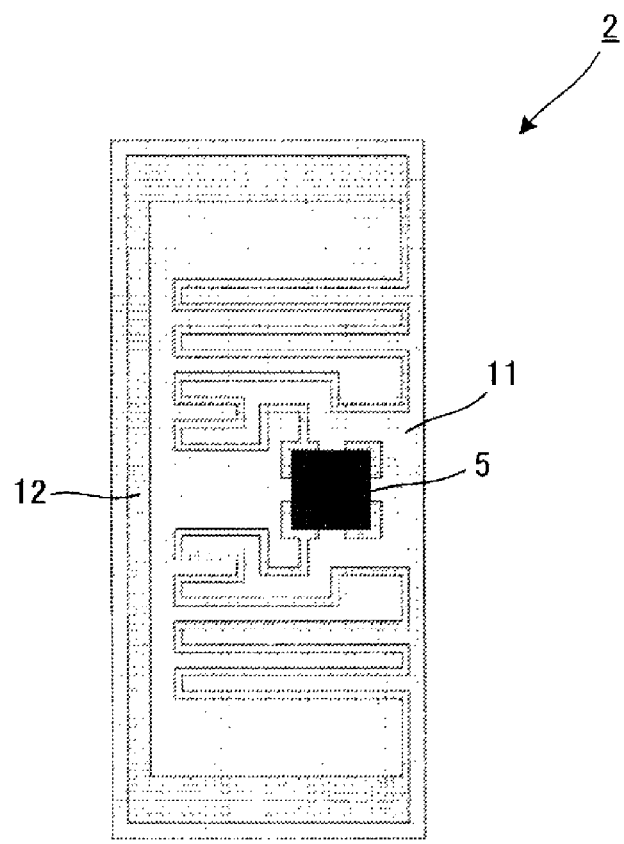
FIGS. 17A and 17B are perspective views of an electromagnetic-coupling module for use in a wireless IC device according to a ninth preferred embodiment of the present invention.
Figure 17B:
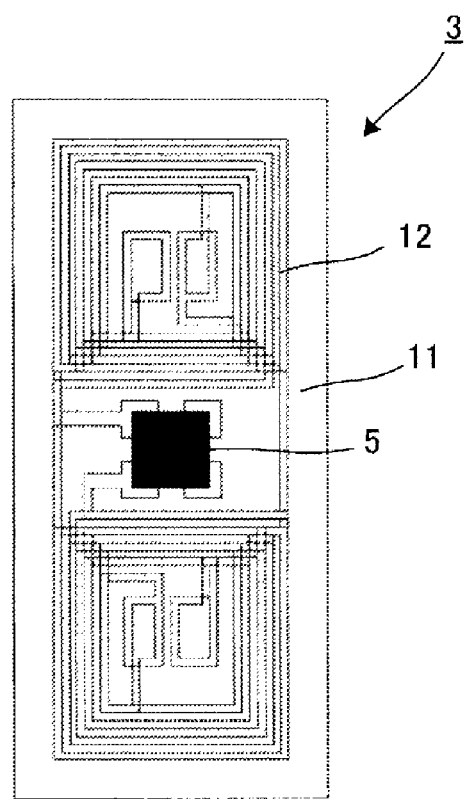

FIGS. 17A and 17B are plan views of electromagnetic-coupling modules 2 and 3, respectively, for use in a wireless IC device according to a ninth preferred embodiment. In an example illustrated in FIG. 17A, a loop electrode 12 and a wireless IC chip implementation land are formed on a substrate 11 as an electrode pattern, and a wireless IC chip 5 is implemented thereon.

In an example illustrated in FIG. 15, in addition to a loop electrode, a capacitor and an inductor for impedance matching and adjustment of a resonant frequency are provided on a feeder circuit board. In contrast, in an example illustrated in FIGS. 17A and 17B, basically, a loop electrode is integral with a wireless IC chip.

In an example illustrated in FIG. 17B, a spiral electrode pattern is formed on each of upper and lower surfaces of the substrate 11. A capacitor electrode sandwiching the substrate 11 is arranged in a substantially central region of the spiral electrode pattern. The lines on the upper and lower surfaces are connected together through the capacitor. That is, the pass length and inductance are gained within a limited area by use of both surfaces of the substrate 11, thus forming the loop electrode 12.

Either of the two electromagnetic-coupling modules 2 and 3 illustrated in FIGS. 17A and 17B are adjacent to a metallic film or metallic plate, acting as a radiation electrode, of an article such that the radiation electrode and the loop electrode 12 are capacitively coupled to each other. As a result, the metallic film or metallic plate of the article can be used as a radiator of an antenna without having to provide an article with a special circuit, as in the case of the first and second preferred embodiments.

Tenth Preferred Embodiment

Figure 18A:
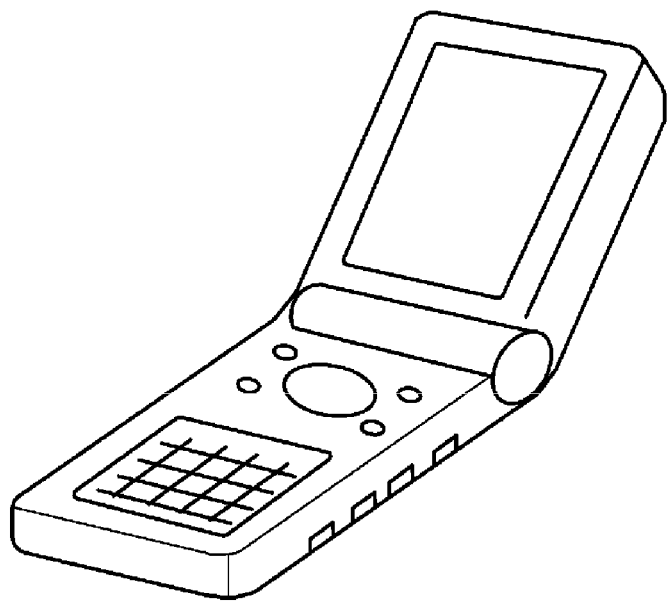
FIGS. 18A and 18B are perspective views of a mobile telephone terminal that includes a wireless IC device according to a tenth preferred embodiment of the present invention and a cross-sectional view of a main portion of an internal circuit board, respectively.
Figure 18B:
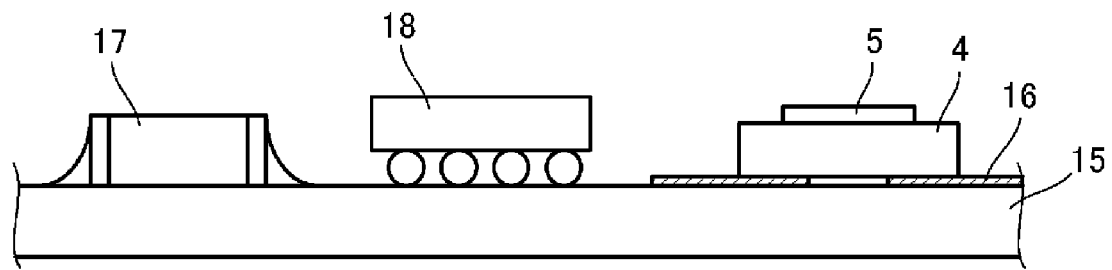

FIG. 18A is a perspective view of a mobile telephone terminal that incorporates a wireless IC device. FIG. 18B is a cross-sectional view of a main portion of an internal circuit board. In addition to electronic components 17 and 18, a feeder circuit board 4 on which a wireless IC chip 5 is mounted is implemented on a circuit board 15 within the mobile telephone terminal. An electrode pattern 16 extends over a predetermined area on the upper surface of the circuit board 15. The electrode pattern 16 is coupled to the wireless IC chip 5 with the feeder circuit board 4 disposed therebetween and acts as a radiation electrode.

Another example is a wireless IC device mounted on a metallic panel on the back of a liquid crystal panel within the mobile telephone terminal illustrated in FIG. 18A. That is, a wireless IC device illustrated in the first to ninth preferred embodiments applied to the metallic panel can be made to act as a radiator of an antenna.

The wireless IC device is applicable to an article that includes a conductive portion having a predetermined area, in addition to the articles described in the preferred embodiments described above. For example, it is applicable to a medicine or snack food packaged in a composite film containing aluminum foil, such as a press through package (PTP).

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A wireless integrated circuit device comprising:
a high-frequency device including a wireless integrated circuit chip; and
a radiation electrode coupled to the high-frequency device mounted thereon, the radiation electrode being part of an article and acting as a radiator; wherein
the radiation electrode includes a conductive portion having a predetermined area, the conductive portion includes a cut-out section in an edge thereof, the high-frequency device is disposed in the cut-out section, and the high-frequency device is coupled to the conductive portion within the cut-out section.

2. The wireless integrated circuit device according to claim 1, further comprising a loop electrode disposed in an implementation region for the high-frequency device such that a loop surface of the loop electrode is oriented in an in-plane direction of the radiation electrode, the loop electrode being coupled to the high-frequency device and being in direct electrical communication with the radiation electrode.

3. The wireless integrated circuit device according to claim 2, further comprising a matching electrode disposed between the implementation region for the high-frequency device and the loop electrode, the matching electrode being configured to enable direct communication between the high-frequency device and the loop electrode.

4. The wireless integrated circuit device according to claim 1, further comprising a loop electrode disposed in an implementation region for the high-frequency device, the loop electrode being coupled to the high-frequency device, the loop electrode being electromagnetically coupled to the radiation electrode with an insulating layer disposed therebetween.

5. The wireless integrated circuit device according to claim 4, further comprising a matching electrode disposed between the implementation region for the high-frequency device and the loop electrode, the matching electrode being configured to enable direct communication between the high-frequency device and the loop electrode.

6. The wireless integrated circuit device according to claim 1, further comprising at least one of a resonant circuit and a matching circuit disposed in the feeder circuit board.

7. The wireless integrated circuit device according to claim 1, wherein the radiation electrode comprises a metallic layer of an article package in which a sheet containing a conductive layer is formed into a bag or a pack.

8. The wireless integrated circuit device according to claim 1, wherein the radiation electrode comprises an electrode pattern disposed on a circuit board in an electronic apparatus.

9. The wireless integrated circuit device according to claim 1, wherein the radiation electrode comprises a metallic plate disposed on a back surface of a component in an electronic apparatus.

10. A wireless integrated circuit device comprising:
a high-frequency device including a wireless integrated circuit chip; and a radiation electrode coupled to the high-frequency device mounted thereon, the radiation electrode being part of an article and acting as a radiator; wherein the radiation electrode includes a conductive portion having a predetermined area and including a non-conductive section, the high-frequency device is disposed at an edge in the non-conductive section, and the high-frequency device is coupled to the conductive portion being in the vicinity of the non-conductive section.

11. The wireless integrated circuit device according to claim 10, further comprising a loop electrode disposed in an implementation region for the high-frequency device such that a loop surface of the loop electrode is oriented in an in-plane direction of the radiation electrode, the loop electrode being coupled to the high-frequency device and being in direct electrical communication with the radiation electrode.

12. The wireless integrated circuit device according to claim 10, further comprising a loop electrode disposed in an implementation region for the high-frequency device, the loop electrode being coupled to the high-frequency device, the loop electrode being electromagnetically coupled to the radiation electrode with an insulating layer disposed therebetween.

13. The wireless integrated circuit device according to claim 12, further comprising a matching electrode disposed between the implementation region for the high-frequency device and the loop electrode, the matching electrode being configured to enable direct communication between the high-frequency device and the loop electrode.

14. The wireless integrated circuit device according to claim 13, further comprising a matching electrode disposed between the implementation region for the high-frequency device and the loop electrode, the matching electrode being configured to enable direct communication between the high-frequency device and the loop electrode.

15. The wireless integrated circuit device according to claim 10, further comprising at least one of a resonant circuit and a matching circuit disposed in the feeder circuit board.

16. The wireless integrated circuit device according to claim 10, wherein the radiation electrode comprises a metallic layer of an article package in which a sheet containing a conductive layer is formed into a bag or a pack.

17. The wireless integrated circuit device according to claim 10, wherein the radiation electrode comprises an electrode pattern disposed on a circuit board in an electronic apparatus.

18. The wireless integrated circuit device according to claim 10, wherein the radiation electrode comprises a metallic plate disposed on a back surface of a component in an electronic apparatus.

* * * * *